United States Patent [19]

Schrader

[11] Patent Number: 4,763,087
[45] Date of Patent: Aug. 9, 1988

[54] IMPEDANCE MATCHING NETWORK

[76] Inventor: Paul D. Schrader, 7001 Briscoe La., Louisville, Ky. 40228

[21] Appl. No.: 866,750

[22] Filed: May 27, 1986

[51] Int. Cl.$^4$ ............................ H03H 7/38; H03H 7/48
[52] U.S. Cl. ........................................ 333/101; 333/32
[58] Field of Search ............... 333/17 M, 32, 124, 129, 333/167, 174, 101; 343/861; 455/120–123, 125

[56] References Cited

U.S. PATENT DOCUMENTS 3,132,313  5/1964  Alford ................................... 333/32
3,537,010 10/1970  Roza et al. ....................... 343/861 X
3,875,537  4/1975  Dolby ................................ 333/14 X

OTHER PUBLICATIONS

Rohde, *Match Antenna Over 1.5-to-30-Mhz, Range With Only Two Adjustable Elements*, Electronic Design, Sep. 13, 1975, p. 96.

*Primary Examiner*—Paul Gensler
*Attorney, Agent, or Firm*—Harry B. O'Donnell, III; Jon C. Winger

[57] ABSTRACT

An impedance matching network circuit of either a T, or Pi-type circuit which minimizes impedance change at the input of the matching network as frequency and/or the load impedance change. This is accomplished in T and Pi-type networks by using a fixed value capacitor or inductance at either the input or output of the network instead of the commonly used variable capacitor or inductance. Further, a switching device can be employed in the T or Pi circuit to selectively reverse the positions of the variable inductance and variable capacitance relative to the input and load sides of the T or Pi circuit.

7 Claims, 6 Drawing Sheets

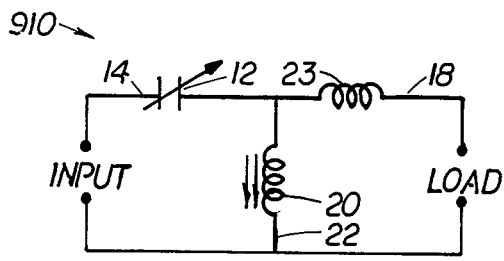
FIG. 10
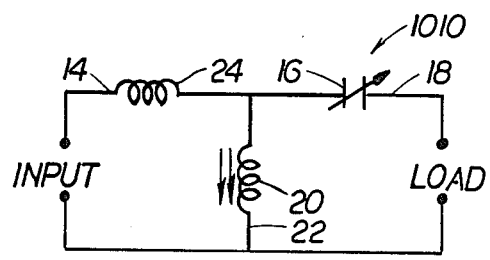
FIG. 11
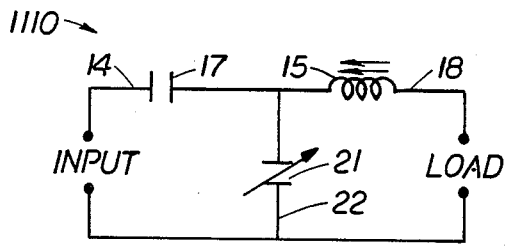
FIG. 12
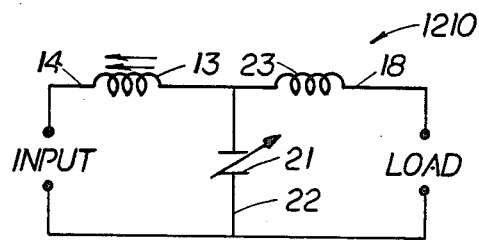
FIG. 13
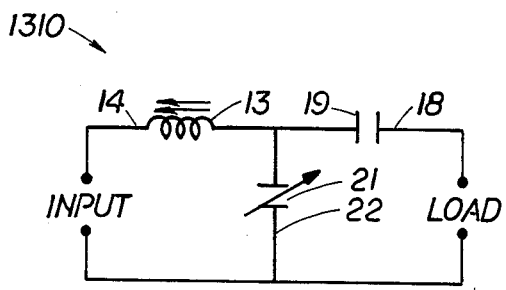
FIG. 14
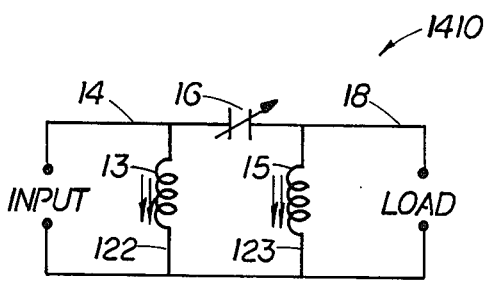
FIG. 15
PRIOR ART
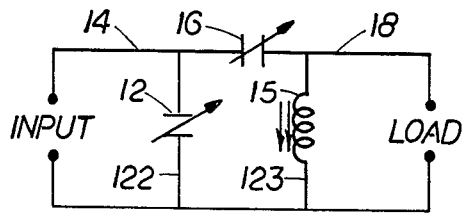
FIG. 16
PRIOR ART
FIG. 17
PRIOR ART
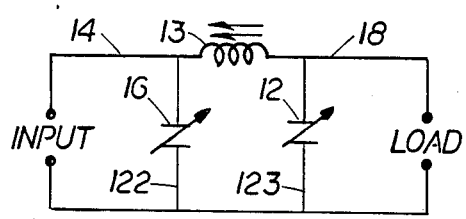
FIG. 18 PRIOR ART
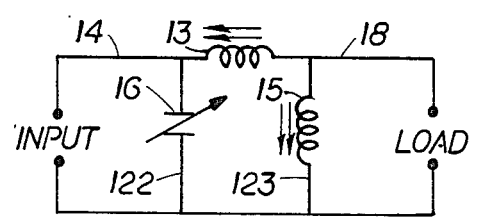
FIG. 19 PRIOR ART

IMPEDANCE MATCHING NETWORK

BACKGROUND OF THE INVENTION

1. Field of the Invention

The present invention relates to adjustable impedance matching networks, and more particularly, an adjustable impedance matching network of either a T or Pi-type which employs a fixed value capacitor or inductor at either the input or output sides of the network.

2. Discussion of the Prior Art

Impedance matching networks are known and are used to establish a condition in which the impedance of a load is equal to the conjugate of the internal impedance of the source. This condition of impedance matching provides for the maximum transfer of power from the source to the load. In a radio transmitter, it is desired to deliver maximum power from the power amplifier to the antenna. Maximum power is transferred from a source to a load, at a given frequency, when the load impedance is equal to the conjugate of the generator impedance. Generally, however, the load impedance will not be the proper value for maximum power transfer, and varies, for example, with frequency, ambient temperature, ground moisture and the like. An impedance matching network is inserted between the load and the source to present to the source an impedance that is the conjugate of the generator impedance.

Prior-art impedance matching networks of the T or Pi-type generally employ variable capacitors and inductors. These old impedance matching networks can be easily mistuned, resulting in excess network power loss, excess inductance current, excess capacitor voltages, and decreased bandwidth, thus causing increases in the matching network losses, and excessive current and voltage.

BRIEF DESCRIPTION OF THE DRAWINGS

The advantages and objectives of the present invention will become clear upon reference to the following detailed description, in conjunction with the accompanying drawings wherein:

FIGS. 8-14 schematically represent various T-type impedance matching networks provided by the present invention;

FIGS. 15-21 schematically represent prior known Pi-type impedance matching networks;

DETAILED DESCRIPTION OF THE PREFERRED EMBODIMENTS

FIGS. 1 through 7 show, in schematic format, prior art T-type matching networks.

Figure 1:
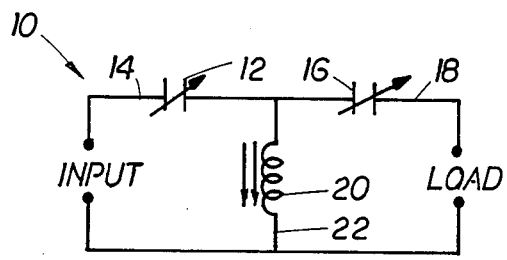
FIGS. 1-7 schematically represent prior known T-type impedance matching networks.

FIG. 1 schematically represents a prior art T-type matching network 10 which includes a variable capacitor 12 in the input side leg 14 connected to the input (transmitter) of the network, a variable capacitor 16 in the load side leg 18 connected to the load (antenna), and a variable inductor 20 in the intervening shunt leg 22 of the network 10.

Figure 2:
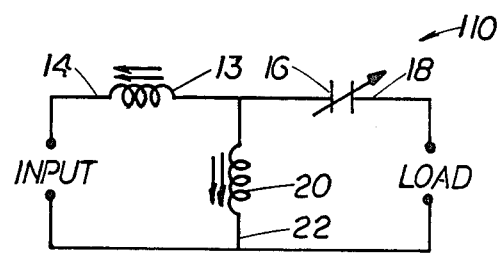

FIG. 2 schematically represents another prior art T-type matching network 110 which includes a variable inductor 13 in the input side leg 14 connected to the input (transmitter), a variable capacitor 16 in the load side leg 18 connected to the load (antenna), and a variable inductor 20 in the intervening shunt leg 22 of the network 110.

Figure 3:
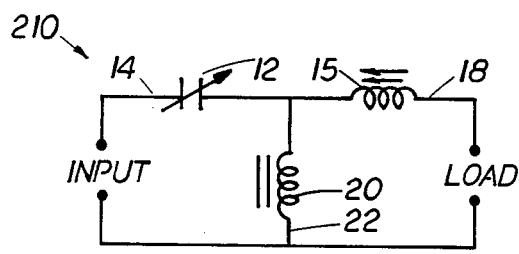

FIG. 3 schematically represents yet another prior art T-type matching network 210 which includes a variable capacitor 12 in the input side leg 14 connected to the input, a variable inductor 15 in the load side leg 18 connected to the load, and a variable inductor 20 in the intervening shunt leg 22 of the network 210.

Figure 4:
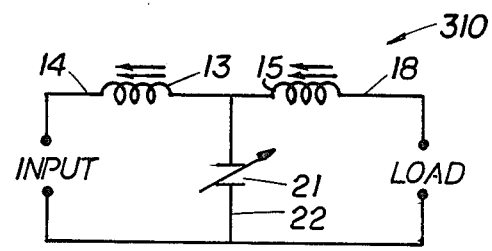

FIG. 4 schematically represents still another prior art T-type matching network 310 which includes a variable inductor 13 in the input side leg 14 connected to the input, a variable inductor 15 in the load side leg 18 connected to the load, and a variable capacitor 21 in the intervening shunt leg 22 of the network 310.

Figure 5:
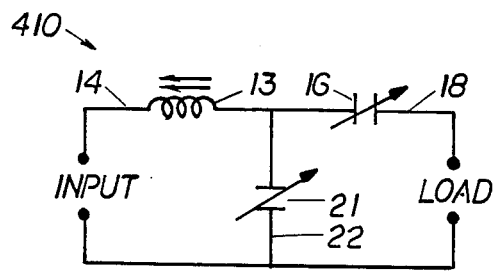

FIG. 5 schematically represents a further prior art T-type matching network 410 which includes a variable inductor 13 in the input side leg 14 connected to the input, a variable capacitor 16 in the load side leg 18 connected to the load, and a variable capacitor 21 in the intervening shunt leg 22 of the network 410.

Figure 6:
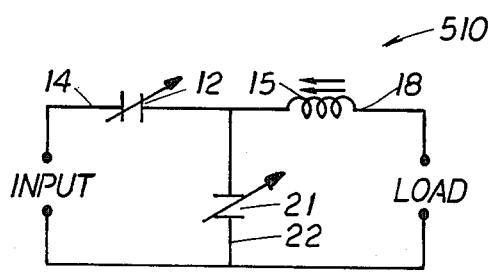

FIG. 6 schematically represents a still further prior art T-type matching network 510 which includes a variable capacitor 12 in the input side leg 14 connected to the input, a variable inductor 15 in the load side leg 18 connected to the load, and a variable capacitor 21 connected in the intervening leg 22 of the network 510.

Figure 7:
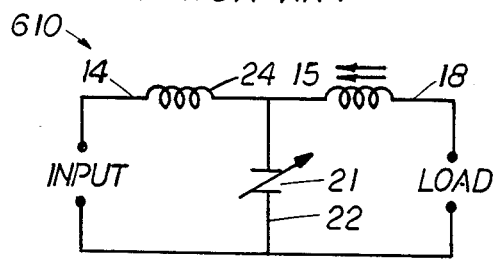

FIG. 7 schematically represents yet a further prior art T-type matching network 610 which includes a fixed inductor 24 in the input side leg 14 connected to the input, a variable inductor 15 in the load side leg 18 connected to the load, and a variable capacitor in the intervening shunt leg 22 of the network 610.

In the prior-art matching networks of FIGS. 1 through 6, each of the capacitors and inductors is variable over a wide range. Hence, with these prior art T-type networks tuning or matching the load impedance to the input impedance is quite a complex operation since it involves the adjustment of three variables. Mistuning results in increasing the matching network losses and unnecessarily increasing current through and/or voltage across the network components.

FIGS. 8 through 14 schematically represent various novel T-type networks provided in accordance with the present invention.

Figure 8:
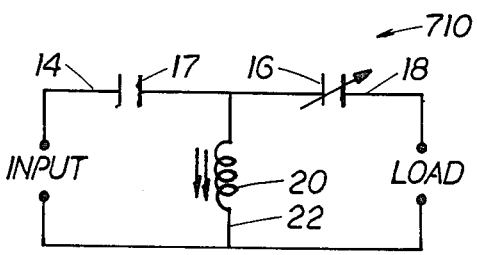

FIG. 8 schematically represents a T-type network 710 which is commonly referred to as an unbalanced network. The network 710 includes a fixed capacitor 17 in the input side leg 14 connected to the input (transmitter), a variable capacitor 16 in the load side leg 18 connected to the load (antenna) and a variable inductor 20 in the intervening shunt leg 22 of the network 710.

Figure 8A:
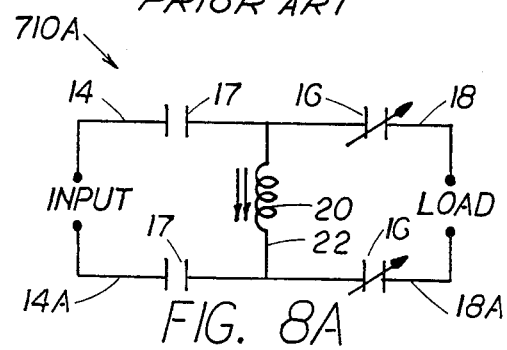

FIG. 8A schematically represents a T-type network 710A which is commonly referred to as a balanced network. The network 710A includes a fixed capacitor 17 in each of the input side legs 14 and 14A connected to the input, a variable capacitor 16 in each of the load side legs 18 and 18A connected to the load, and a variable inductor 20 in the intervening shunt leg 22 of the network 710A.

Figure 9:
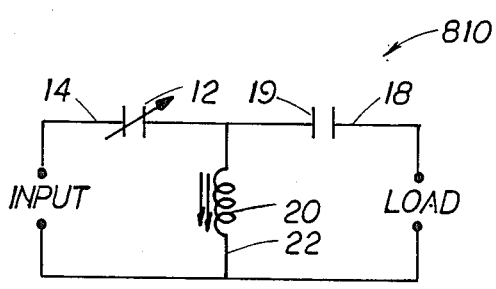

FIG. 9 schematically represents a T-type network 810 which includes a variable capacitor 12 in the input side leg 14 connected to the input, a fixed capacitor 19 in the load side leg 18 connected to the load, and a variable inductor 20 in the intervening shunt leg 22 of the network 810.

FIG. 10 schematically represents a T-type network 910 which includes a variable capacitor 12 in the input side leg 14 connected to the input, a fixed inductor 23 in the load side leg 18 connected to the load, and a variable inductor 20 in the intervening shunt leg 22 of the network 910.

FIG. 11 schematically represents a T-type network 1010 which includes a fixed inductor 24 in the input side leg 14 connected to the input, a variable capacitor 16 in the load side leg 18 connected to the load, and a variable inductor 20 in the intervening shunt leg 22 of the network 1010.

FIG. 12 schematically represents a T-type network 1110 which includes a fixed capacitor 17 in the input side leg 14 connected to the input, a variable inductor 15 in the load side leg 18 connected to the load, and a variable capacitor 21 in the intervening shunt leg 22 of the network 1110.

FIG. 13 schematically represents a T-type network 1210 which includes a variable inductor 13 in the input side leg 14 connected to the input, a fixed inductor 23 in the load side leg 18 connected to the load, and a variable capacitor 21 in the intervening shunt leg 22 of the network 1210.

FIG. 14 schematically represents a T-type network 1310 which includes a variable inductor 13 in the input side leg 14 connected to the input, a fixed capacitor 19 in the load side leg 18 connected to the load, and a variable capacitor 21 in the intervening shunt leg 22 of the network 1310.

It should be noted at this point that the present invention is not limited to the examples of unbalanced T-type networks described in connection with FIGS. 8 through 14, but also encompasses balanced T-type networks, such as shown in FIG. 8A, corresponding to each of the unbalanced networks of FIGS. 8 through 14 as well.

FIGS. 15 through 21 show, in schematic format, prior art Pi-type matching networks.

FIG. 15 represents a Pi-type matching network 1410 which includes a variable capacitor 16 in the intervening leg of the network in series connection with the input (transmitter) and load (antenna), and two variable inductors 13 and 15. Inductor 13 of input side leg 122 is in parallel with the input, and inductor 15 of the load side leg 123 is in parallel with the load of the network 1410.

FIG. 16 represents a Pi-type matching network 1510 which includes a variable capacitor 16 in the intervening leg of the network in series connection with the input and load, a variable capacitor 12 in the input side leg 122, and a variable inductor 15 in the load side leg 123 of the network 1510. Capacitor 12 of the input side leg 122 is in parallel with the input, and inductor 15 of the load side leg 123 is in parallel with the load of the network 1510.

FIG. 17 represents a Pi-type matching network 1610 which includes a variable capacitor 16 in the intervening leg of the network in series connection with the input and load, a variable inductor 15 in the input side leg 122, and a variable capacitor 12 in the load side leg 123 of the network 1610. Inductor 15 of the input side leg 122 is in parallel with the input, and capacitor 12 of the load side leg 123 is in parallel with the load of the network 1610.

FIG. 18 represents a Pi-type matching network 1710 which includes a variable inductor 13 in the intervening leg in series connection with the input and load, a variable capacitor 16 in the input side leg 122, and a variable capacitor 12 in the load side leg 123 of the network 1710. Capacitor 16 of the input side leg 122 is in parallel with the input and capacitor 12 of the load side leg 123 is in parallel with the load of the network 1710.

FIG. 19 represents a Pi-type matching network 1810 which includes a variable inductor 13 in the intervening leg in series connection with the input and load, a variable capacitor 16 in the input side leg 122, and a variable inductor 15 in the leg 123 of the network 1810. Capacitor 16 of the input side leg 122 is in parallel with the input and inductor 15 of the load side leg 123 is in parallel with the load of the network 1810.

Figure 20:
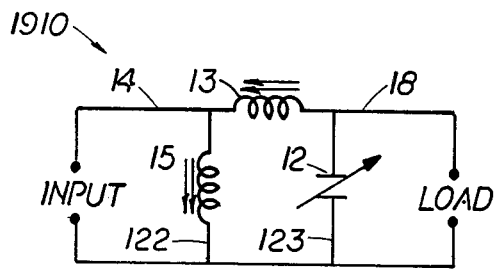

FIG. 20 represents a Pi-type matching network 1910 which includes a variable inductor 13 in the intervening leg in series connection with the input and load, a variable inductor 15 in the input side leg 122, and a variable capacitor 12 in the load side leg 123 of the network 1910. Inductor 15 of the input side leg 122 is in parallel with the input, and a capacitor 12 of the load side leg 123 is in parallel with the load of the network 1910.

Figure 21:
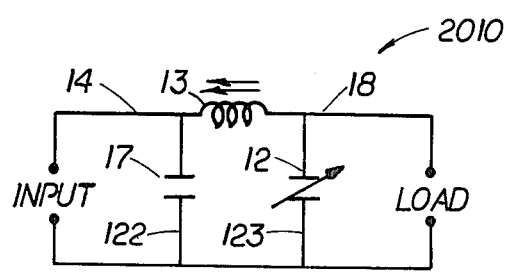

FIG. 21 represents a Pi-type matching network 2010 which includes a variable inductor 13 in the intervening leg in series connection with the input and load, a fixed capacitor 17 in the input side leg 122 and a variable capacitor 12 in the load side leg 123 of the network 2010. Capacitor 17 of the input leg 122 is in parallel with the input, and capacitor 12 of the load side leg 123 is in parallel with the load of the network 2010.

FIGS. 22 through 28 schematically represent various novel Pi-type networks provided in accordance with the present invention.

Figure 22:
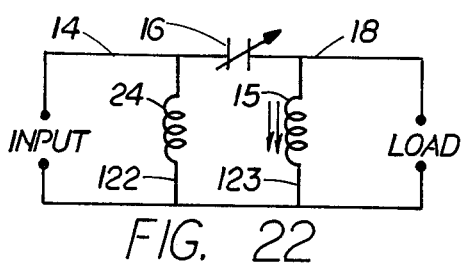
FIGS. 22-28 schematically represent various Pi-type impedance matching networks provided by the present invention.

FIG. 22 schematically represents a Pi-type network 2110 which includes a variable capacitor 16 in the intervening leg in series connection with the input (transmitter) and load (antenna), a fixed inductor 24 in the input side leg 122, and a variable inductor 15 in the load side leg 123 of the network 2110. Fixed inductor 24 of the input side leg 122 is in parallel with the input, and variable inductor 15 of the load side leg 123 is in parallel with the load of the network 2110.

Figure 23:
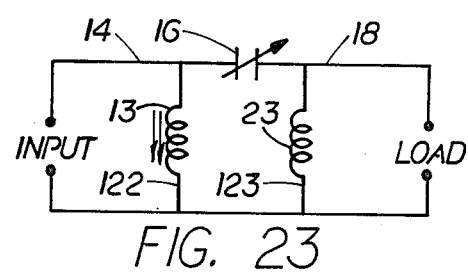

FIG. 23 schematically represents a Pi-type network 2210 which includes variable capacitor 16 in the intervening leg in series connection with the input and load, a variable inductor 13 in the input side leg 122, and a fixed inductor 23 in the load side leg 123 of the network 2210. Variable inductor 13 of the input side leg 122 is in parallel with the input, and fixed inductor 23 of the load side leg 123 is in parallel with the load of the network 2210.

Figure 24:
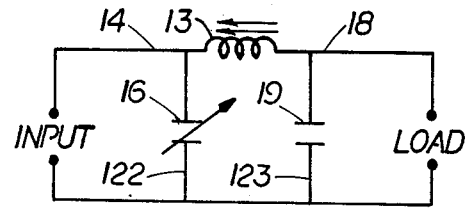

FIG. 24 schematically represents a Pi-type network 2310 which includes a variable inductor 13 in the intervening leg in series connection with the input and load, a variable capacitor 16 in the input side leg 122 and a fixed capacitor 19 in the load side leg 123 of the network 2310. Variable capacitor 16 of the input side leg 122 is in parallel with the input, and fixed capacitor 19 of the load side leg 123 is in parallel with the load of the network 2310.

Figure 25:
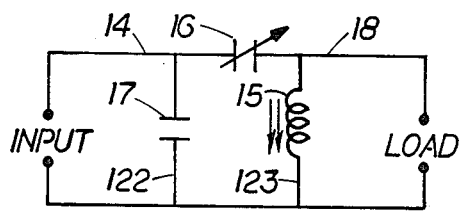

FIG. 25 schematically represents a Pi-type network 2410 which includes a variable capacitor 16 in the intervening leg in series connection with the input and load, a fixed capacitor 17 in the input side leg 122 and a variable inductor 15 in the load side leg 123 of the network 2410. Fixed capacitor 17 of the input side leg 122 is in parallel with the input, and variable inductor 15 of the load side leg 123 is in parallel with the load of the network 2410.

Figure 26:
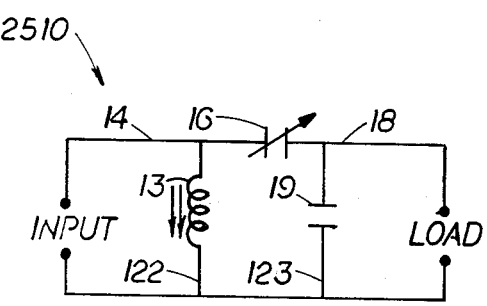

FIG. 26 schematically represents a Pi-type network 2510 which includes a variable capacitor 16 in the intervening leg in series connection with the input and load, a variable inductor 13 in the input side leg 122 and a fixed capacitor 19 in the load side leg 123 of the network 2510. Variable inductor 13 of the input side leg 122 is in parallel with the input, and fixed capacitor 19 of the load side leg 123 is in parallel with the load of the network 2510.

Figure 27:
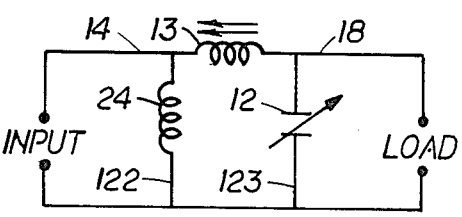

FIG. 27 schematically represents a Pi-type network 2610 which includes a variable inductor 13 in the intervening leg in series with the input and load, a fixed inductor 24 in the input side leg 122 and a variable capacitor 12 in the load side leg 123 of the network 2610. Fixed inductor 24 of the input side leg 122 is in parallel with the input, and variable capacitor 12 of the load side leg 123 is in parallel with the load of the network 2610.

Figure 28:
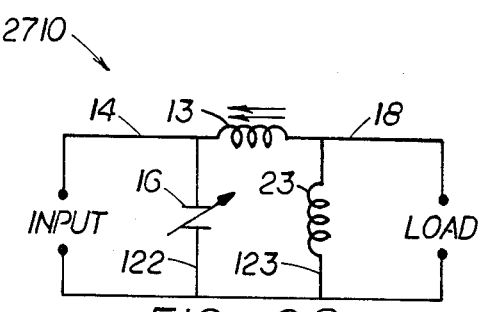

FIG. 28 schematically represents a Pi-type network 2710 which includes a variable inductor 13 in the intervening leg in series with the input and load, a variable capacitor 16 in the input side leg 122 and a fixed inductor 23 in the load side leg 123 of the network 2710. Variable capacitor 16 of the input side leg 122 is in parallel with the input, and fixed inductor 23 of the load side leg 123 is in parallel with the load of the network 2710.

It should be noted at this point that the present invention is not limited to the unbalanced Pi-type networks described in connection with FIGS. 22-28, but also encompasses balanced Pi-type networks corresponding to each of the unbalanced networks of FIGS. 22-28 as well.

While the T-type and Pi-type networks have been discussed in relationship to antenna matching circuits, it should be clearly understood that they can be utilized for other purposes such as, for example, transmitter output matching circuits and the like.

Figure 29:
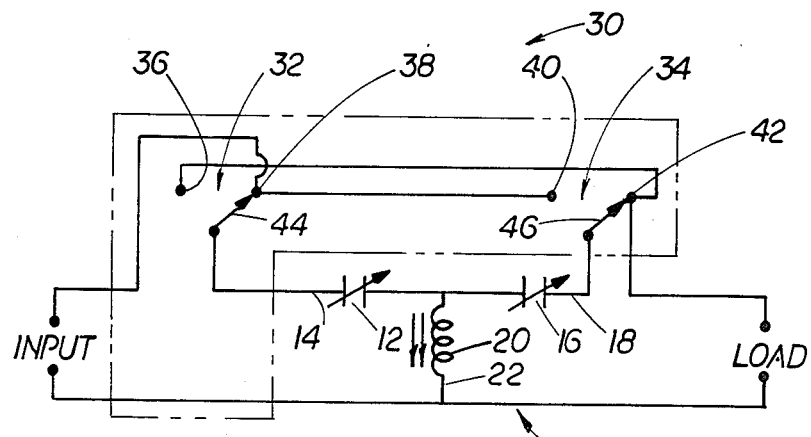
FIGS. 29 and 30 schematically represent a switching device of the present invention incorporated in a T-type impedance matching network.
Figure 30:
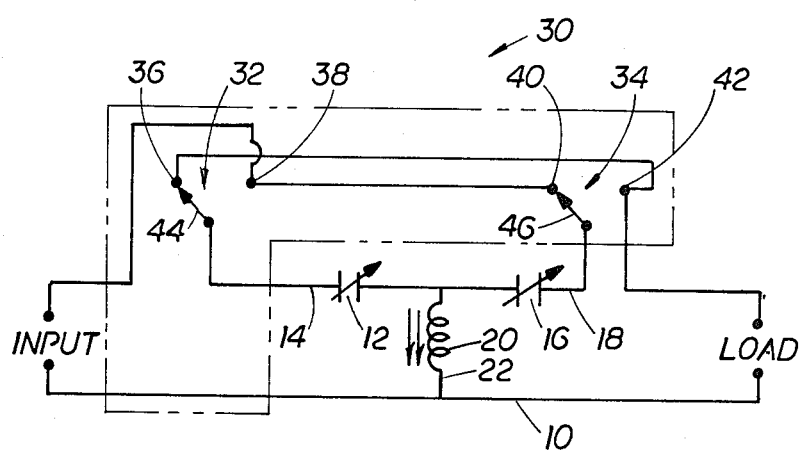
Figure 31:
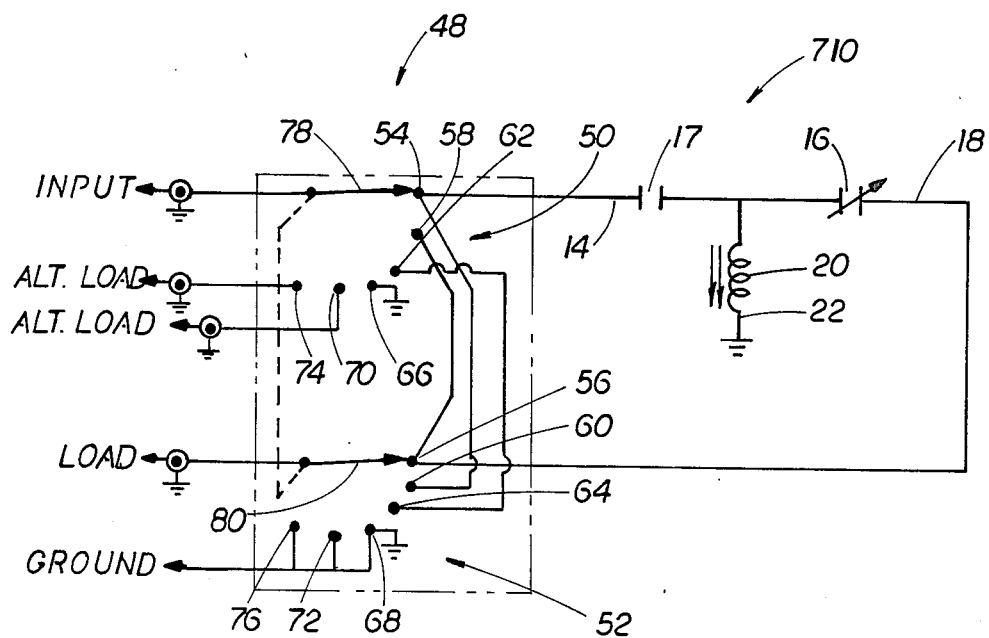
FIGS. 31-36 schematically represent another switching device of the present invention incorporated in a T-type impedance matching network.
Figure 32:
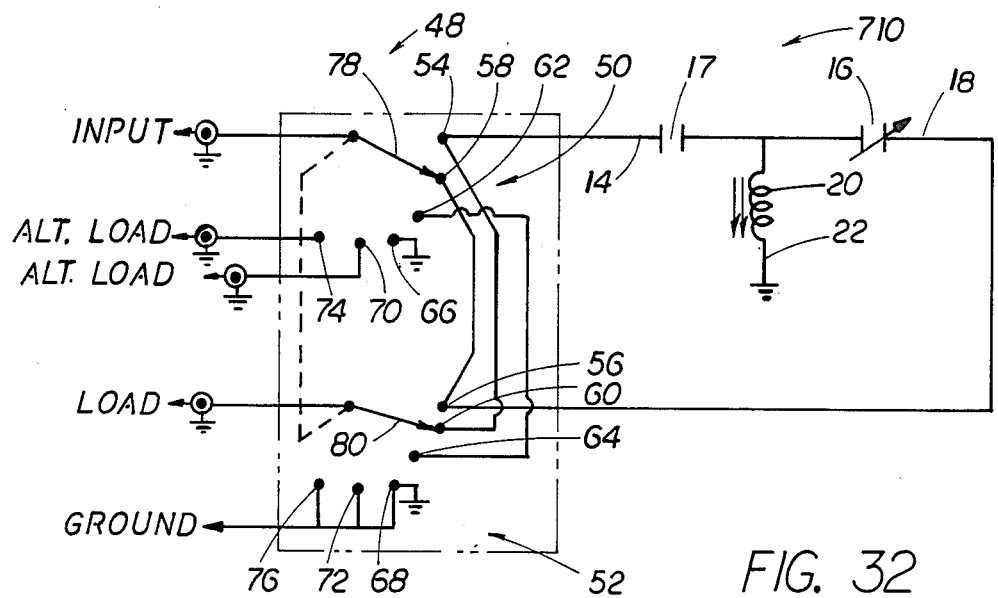
Figure 33:
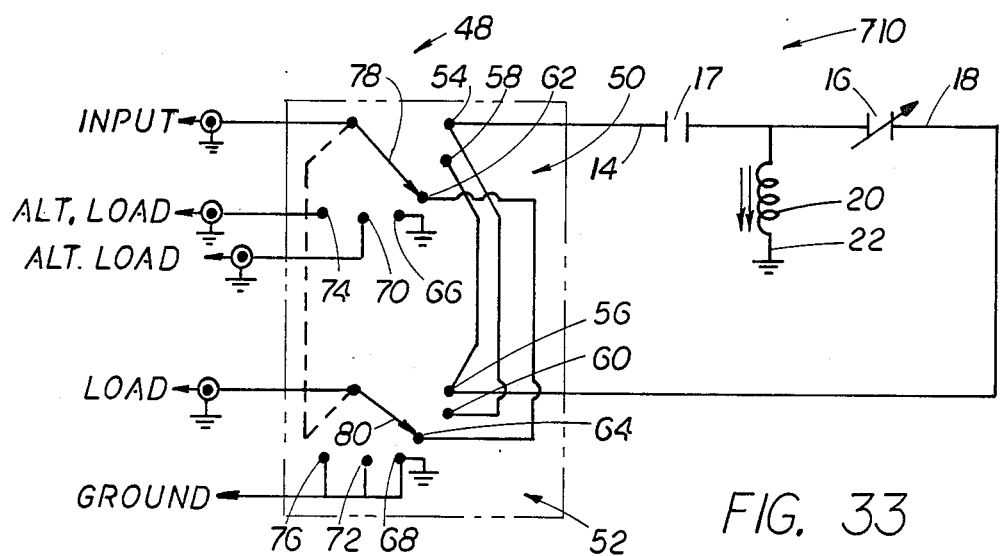
Figure 34:
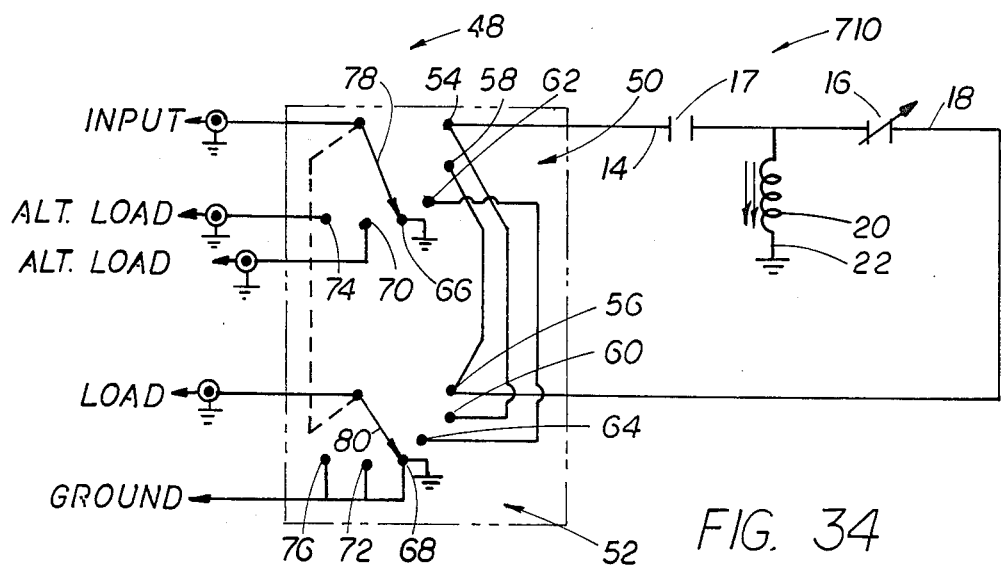
Figure 35:
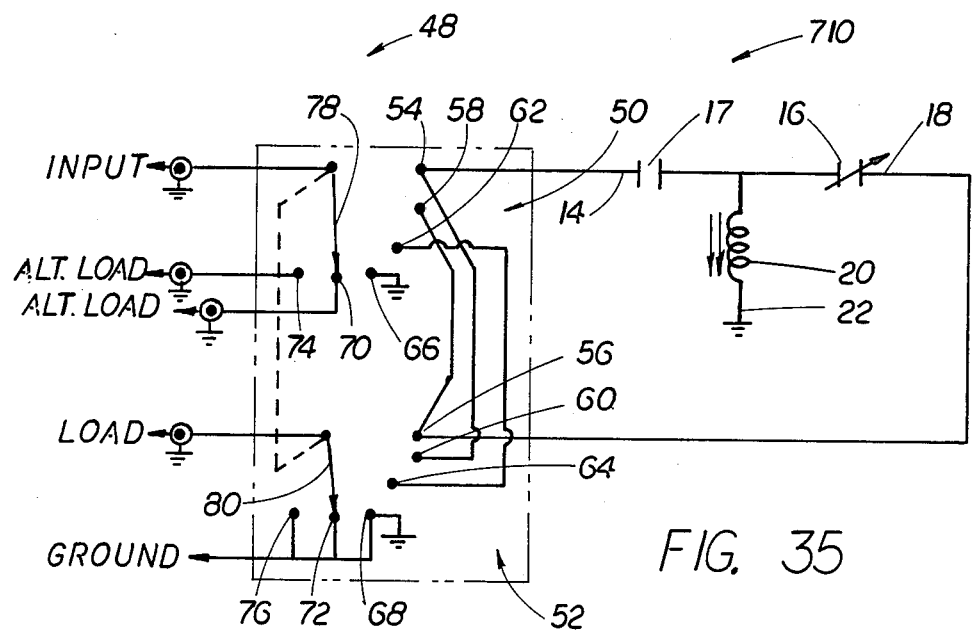
Figure 36:
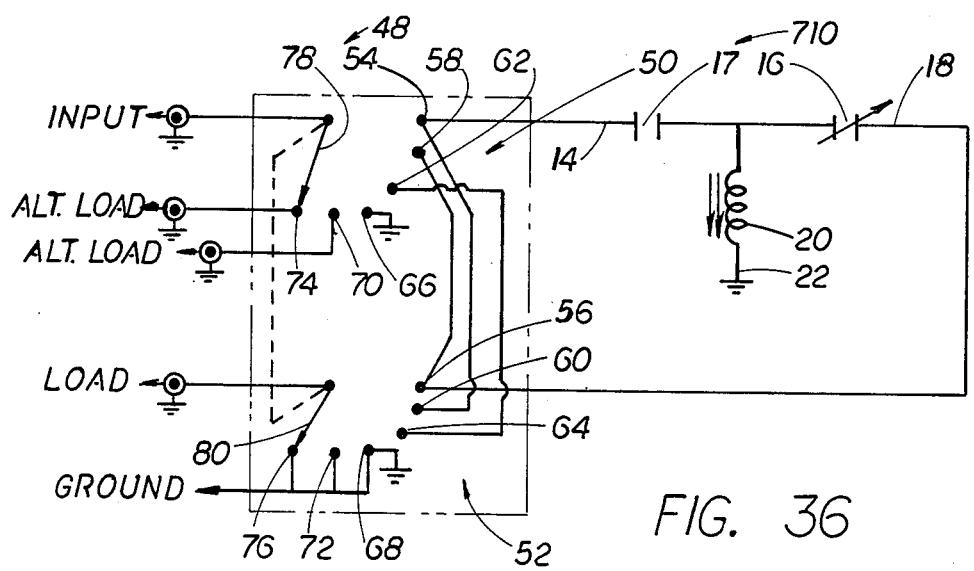

FIGS. 29 and 30 schematically represent a T-type matching network, for example, heretofore known matching network 10, incorporating a switching device 30 for reversing the positions of the components in the input side leg 14 and the load side leg 18 of the network 10 relative to the input (transmitter) and load (antenna). The switching device 30 is of the double pole, double throw type having a first set of contacts 32 in series with the component (variable capacitor) 12 in the matching circuit network input side leg 14 connected to the input, and a second set of contacts 34 in series with the component (variable capacitor) 16 in the matching circuit network load side leg 18 connected to the load. The first set of contacts 32 has a first contact 36 and a second contact 38, and the second set of contacts 34 has a first contact 40 and a second contact 42. The first contact 36 of the first set of contacts 32 is connected in parallel with the second contact 42 of the second set of contacts 34, and the second contact 38 of the first set of contacts 32 is connected in parallel with the first contact 40 of the second set of contacts 34. The input (transmitter) is connected in series with the second contact 38 of the first set of contacts 32, and the load (antenna) is connected in series with the second contact 42 of the second set of contacts 32. The switch 44 of the first set of contacts 32 and the switch 46 of the second set of contacts 34 move together or in unison between a first position (See FIG. 29) whereat the switch 44 closes the second contact 38 of the first set of contacts 32 and the switch 46 closes the second contact 42 of the second set of contacts 34, and a second position (See FIG. 30) whereat the switch 44 closes the first contact 36 of the first set of contacts 32 and the switch 46 closes the first contact 40 of the second set of contacts 34. When the switches 44 and 46 of the switching device 30 are in the first position (FIG. 29) the component (variable capacitor) 12 in the network input side leg 14 is directly connected in series to the input (transmitter) and the other component (variable capacitor) 16 in the network load side leg 18 is directly connected in series to the load (antenna). When the switches 44 and 46 of the switching device 30 are in the second position (FIG. 30) the positions of the component 12 in the network input side leg 14 and component 16 in the network load side leg 18 change positions relative to the input and load. In the second position the component (variable capacitor) 12 in the network input side leg 14 is directly connected in series to the load (antenna) and the other component (variable capacitor) 16 in the network load side leg 18 is directly connected in series to the input (transmitter).

It should be clearly understood that the switching device 30 can be used in any prior art T-type matching network, any of the new T-type networks illustrated in FIGS. 8-14 and their corresponding balanced networks, any of the prior art Pi-type networks as well as any of the new Pi-type networks illustrated in FIGS. 22-28 and their corresponding balanced networks.

Now with reference to FIGS. 31 through 36, there is shown another new switching device, generally denoted as the numeral 48, incorporated in a T-type matching network, for example network 710 of FIG. 8. The switching device 48 is basically the same as the switching device 30 but provides additional features allowing the network 710 to be selectively bypassed, connecting the input directly to the primary load, and selectively connecting the input directly to an alternate load and the primary load to ground. The switching device 48 comprises a first set of contacts 50 and a second set of contacts 52. The first set of contacts 50 includes six contacts and the second set of contacts 52 includes six contacts. The first contact 54 of the first contact set 50 is located in the network input side leg 14 in series with and between the input and component (fixed capacitor) 17 in the network input side leg 14, and the first contact 56 of the second contact set 52 is located in the network load side leg 18 in series with and between the load and the component (variable capacitor) 16 in the network load side leg 18. The second contact 58 of the first contact set 50 is located next to the first contact 54 and is connected in parallel with the first contact 56 of the second contact set 52. The second contact 60 of the second contact set 52 is located next to the first contact 56 and is connected in parallel with the first contact 54 of the first contact set 50. The third contact 62 of the first contact set 50 is located next to the second contact 58 and is connected in parallel to the third contact 64 of the second contact set 52 which is located next to the second contact 60. The fourth contact 66 of the first contact set 50 is located next to the third contact 62 and is connected to ground. Similarly, the fourth contact 68 of the second contact set 52 is located next to the third contact 64 and is also connected to ground. The fifth contact 70 of the first contact set 50 is located next to the fourth contact 66 and is connected to an alternative piece of equipment such as an alternate antenna or dummy load. The fifth contact 72 of the second contact set 52 is located next to the fourth contact 68 and is connected to ground. The sixth contact 74 of the first contact set 50 is located next to the fifth contact 70 and is connected to another alternative piece of equipment such as an alternate antenna or dummy load. The sixth contact 76 of the second contact set 52 is located next to the fifth contact 72 and is connected to ground. The switch 78 of the first contact set 50 and the switch 80 of the second contact set 52 move together or in unison between first, second, third, fourth, fifth and sixth positions as illustrated in FIGS. 31 through 36, respectively. When the switches 78 and 80 of the switching device 48 are in the first position (FIG. 31) the switch 78 closes the first contact 54 of the first contact set 50 and the switch 80 closes the first contact 56 of the second contact set 52 so that the component (fixed capacitor) 17 in the network input side leg 14 is directly connected in series to the input (transmitter) and the other component (variable capacitor) 16 in the network load side leg 18 is directly connected in series to the load (antenna). When the switches 78 and 80 of the switching device 48 are in the second position (FIG. 32) the switch 78 closes the second contact 58 of the first contact set 50 and the switch 80 closes the second contact 60 of the second contact set 52 so that the component (variable capacitor) 16 in the network load side leg 18 is directly connected in series to the input (transmitter) and the component (fixed capacitor) 17 in the network input side leg 14 is directly connected in series to the load (antenna). When the switches 78 and 80 of the switching device 48 are in the third position (FIG. 33) the switch 78 closes the third contact 62 of the first contact set 50 and the switch 80 closes the third contact 64 of the second contact set 52 so that the matching network 710 is bypasssed or shunted. When the switches 78 and 80 of the switching device 48 are in the fourth position (FIG. 34) the switch 78 closes the fourth contact 66 of the first contact set 50 and the switch 80 closes the fourth contact 68 of the second contact set 52 so that the input (transmitter) is connected directly to ground and the load (antenna) is connected directly to ground. When the switches 78 and 80 of the switching device 48 are in the fifth position (FIG. 35), the switch 78 closes the fifth contact 70 of the first contact set 50 and switch 80 closes the fifth contact 72 of the second contact set 52 so that the input (transmitter) is connected directly to an alternate piece of equipment, such as a second antenna, and the primary antenna is connected directly to ground. When the switches 78 and 80 of the switching device 48 are in the sixth position (FIG. 36), the switch 78 closes the sixth contact 74 of the first contact set 50 and switch 80 closes the sixth contact 76 of the second contact set 52 so that the input (transmitter) is connected directly to an alternate piece of equipment, such as a dummy load, and the load (antenna) is connected directly to ground.

It should be clearly understood that a switch device can be used with any T-type and Pi-type matching network, balanced or unbalanced for reversing the network relative to the input and load.

The foregoing detailed description is given primarily for clearness of understanding and no unnecessary limitations are to be understood therefrom for modifications will become obvious to those skilled in the art upon reading this disclosure and may be made without departing from the spirit of the invention or scope of the appended claims.

What is claimed is:

1. In an impedance matching network interconnecting an input to a load comprising an input side leg and an output side leg with an intervening common leg therebetween, the improvement comprising switch means for selectively interconnecting the input side leg to either the input or load of the network and concurrently alternately interconnecting the load side leg to the load or input respectively, of the network.

2. The impedance matching network of claim 1, wherein the matching network is a T-type network.

3. The impedance matching network of claim 1, wherein the matching network is a Pi-type network.

4. A switch device for connecting an impedance matching network to an input and a load, the matching network comprising an input side leg and a load side leg, the switch device comprising means for selectively interconnecting the input side leg to either the input or load of the network and concurrently alternately interconnecting the load side leg to the load or input, respectively.

5. The switch device of claim 4, further comprising means for selectively connecting the input directly to the load bypassing the matching network.

6. The switch device of claim 4, further comprising means for selectively connecting the input to ground, and the load to ground, bypassing the matching network.

7. The switch device of claim 4, further comprising means for selectively connecting the input to an alternative load, and the load to ground, bypassing the matching network.

* * * * *